(12) United States Patent
Guan et al.

(10) Patent No.: US 12,107,004 B2
(45) Date of Patent: Oct. 1, 2024

(54) IN-SITU CMP SELF-ASSEMBLED MONOLAYER FOR ENHANCING METAL-DIELECTRIC ADHESION AND PREVENTING METAL DIFFUSION

(71) Applicant: Taiwan Semiconductor Manufacturing Co., Ltd., Hsinchu (TW)

(72) Inventors: Zhen Yu Guan, Hsinchu (TW); Hsun-Chung Kuang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/362,797

(22) Filed: Jul. 31, 2023

(65) Prior Publication Data

US 2023/0377959 A1    Nov. 23, 2023

Related U.S. Application Data (62) Division of application No. 17/070,853, filed on Oct. 14, 2020, now Pat. No. 11,810,817.

(51) Int. Cl.
*H01L 21/768* (2006.01)
*H01L 21/02* (2006.01)
*H01L 23/532* (2006.01)

(52) U.S. Cl.
CPC .. *H01L 21/76834* (2013.01); *H01L 21/02282* (2013.01); *H01L 23/53223* (2013.01); *H01L 23/53238* (2013.01); *H01L 23/53252* (2013.01); *H01L 23/53266* (2013.01); *H01L 21/0206* (2013.01); *H01L 21/02074* (2013.01); *H01L 21/7684* (2013.01); *H01L 21/76843* (2013.01)

(58) Field of Classification Search
CPC ......... H01L 21/76834; H01L 21/02282; H01L 23/53223; H01L 23/53238; H01L 23/53252; H01L 23/53266; H01L 21/0206; H01L 21/02074; H01L 21/7684; H01L 21/76843; H01L 21/02304; H01L 21/02307; H01L 21/76829; H01L 21/76883; H01L 21/321; H01L 23/528; H01L 23/5329; H01L 2221/1052
See application file for complete search history.

(56) References Cited

U.S. PATENT DOCUMENTS 6,187,682 B1    2/2001  Denning et al.
2004/0161873 A1    8/2004  Dimitrakopoulos et al.
(Continued)

FOREIGN PATENT DOCUMENTS

TW    2014/25624 A    7/2014

*Primary Examiner* — Thanh T Nguyen
(74) *Attorney, Agent, or Firm* — Seed IP Law Group LLP (57) ABSTRACT

A semiconductor structure including a self-assembled monolayer for enhancing metal-dielectric adhesion and preventing metal diffusion is provided. The semiconductor structure includes a substrate and a first dielectric layer on the substrate. A contact structure is embedded in the first dielectric layer and includes a conductive line. The semiconductor structure further includes a self-assembled monolayer on the conductive line, and a second dielectric layer on the first dielectric layer and the conductive line. The self-assembled monolayer is chemically bonded to the conductive line and the second dielectric layer.

20 Claims, 5 Drawing Sheets

(56) References Cited

U.S. PATENT DOCUMENTS

| | | | |
|---|---|---|---|
| 2013/0221524 A1 | 8/2013 | Augur et al. | |
| 2014/0045330 A1 | 2/2014 | Tong | |
| 2014/0231998 A1 | 8/2014 | Kuo et al. | |
| 2015/0147879 A1* | 5/2015 | Chatterjee | H01L 23/53238 438/653 |
| 2015/0333012 A1 | 11/2015 | Chang et al. | |
| 2017/0092533 A1* | 3/2017 | Chakraborty | H01L 21/3212 |
| 2017/0218503 A1 | 8/2017 | Bellman et al. | |
| 2021/0398846 A1* | 12/2021 | Tapily | H01L 21/02065 |
| 2022/0037202 A1* | 2/2022 | Lin | H01L 21/76834 |

* cited by examiner

IN-SITU CMP SELF-ASSEMBLED MONOLAYER FOR ENHANCING METAL-DIELECTRIC ADHESION AND PREVENTING METAL DIFFUSION

BACKGROUND

Integrated circuits include numerous devices such as transistors, capacitors, resistors, and diodes. These devices, which are initially isolated from one another, are interconnected together through wiring to form functional circuits. Such wiring is done through multiple metallization layers including metal lines, providing lateral electrical connection, and a plurality of vias, providing vertical electrical connection between two neighboring stacked metallization layers. The metal lines and vias are commonly referred to as interconnect structures. Interconnect structures are increasingly determining the limits of performance and the density of advanced integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Metal interconnects are typically fabricated using a damascene process in which trench openings and via openings are etched into dielectric layers. The trench openings and via openings are filled with a metal, which is then planarized using, for example, a chemical mechanical polishing (CMP) process.

In a multilayer interconnect structure, metal lines (e.g., copper lines) are laid in stacked dielectric layers and are connected through vias from one layer to another layer. Metal lines and vias are fabricated using single or dual damascene processes described above in some instances. In such processes, after formation of lower level metal lines in a dielectric layer, another dielectric layer is formed over the dielectric layer and is patterned to form trench openings and via openings. The trench openings and the via openings are then filled with a metal to form upper level metal lines and vias, respectively.

A problem that affects the electrical reliability of the multilayer interconnect structure is the adhesion between an upper dielectric layer and the underlying metal lines. Poor metal line-to-dielectric layer adhesion could lead to delamination. Delamination occurs when a portion of the metal line peels apart or separates from the overlying dielectric layer. Delamination of the metal line from the overlying dielectric layer may occur for several reasons, including thermal stresses and intrinsic stresses of the film during deposition of the overlying dielectric layer. Thus, in the manufacture of semiconductor devices, it is important to have reliable metal line-to-dielectric layer adhesion.

Metal lines are typically made of a conductive metal, for example, copper. The diffusion of copper from the metal lines to the overlying dielectric layer can lead to not only degradation of the multilayer interconnect structure, but also decrease of the overall performance of integrated circuits.

In embodiments of the present disclosure, to improve metal line-dielectric adhesion between adjacent metallization layers, a self-assembled monolayer is formed between a metal line and an overlying dielectric layer. The self-assembled monolayer is formed from self-assembly molecules which can chemically bound to both the metal line and the overlying dielectric layer. Due to the strong binding strength of the covalent bonds formed, the self-assembled monolayer helps to improve adhesion between the metal line and the overlying dielectric layer. The presence of the self-assembled monolayer thus helps to reduce the peeling or delamination of the dielectric layer from the metal line. The self-assembled monolayer physically separates the metal line from the overlying dielectric layer. The self-assembled monolayer thus also acts as a diffusion barrier to prevent the conductive metal in the metal line from diffusing into the overlying dielectric layer. As a result, the leakage caused by the diffusion of the conductive metal between the stacked metallization layers is reduced.

Figure 1:
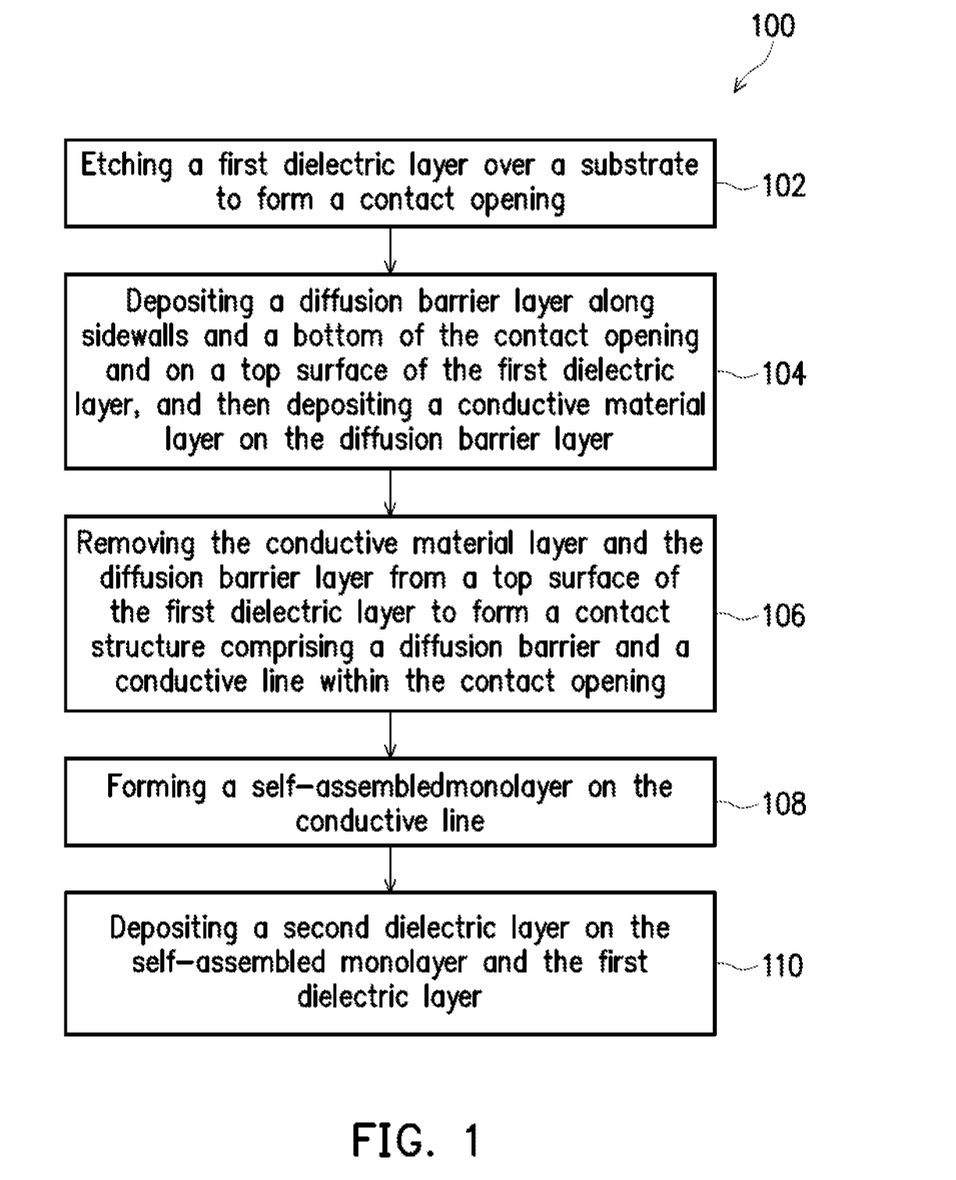
FIG. 1 is a flowchart of a method for fabricating a semiconductor structure, in accordance with some embodiments.

FIG. 1 is a flowchart of a method 100 for fabricating a semiconductor structure 200, in accordance with some embodiments. FIGS. 2A-2D are cross-sectional views of the semiconductor structure 200 in various stages of the method 100, in accordance with some embodiments. The method 100 is discussed in detail below, with reference to the semiconductor structure 200, in FIGS. 2A-2E. In some embodiments, additional operations are performed before, during, and/or after the method 100, or some of the operations described are replaced and/or eliminated. In some embodiments, additional features are added to the semiconductor structure 200. In some embodiments, some of the features described below are replaced or eliminated. One of ordinary skill in the art would understand that although some embodiments are discussed with operations performed in a particular order, these operations may be performed in another logical order.

Figure 2A:
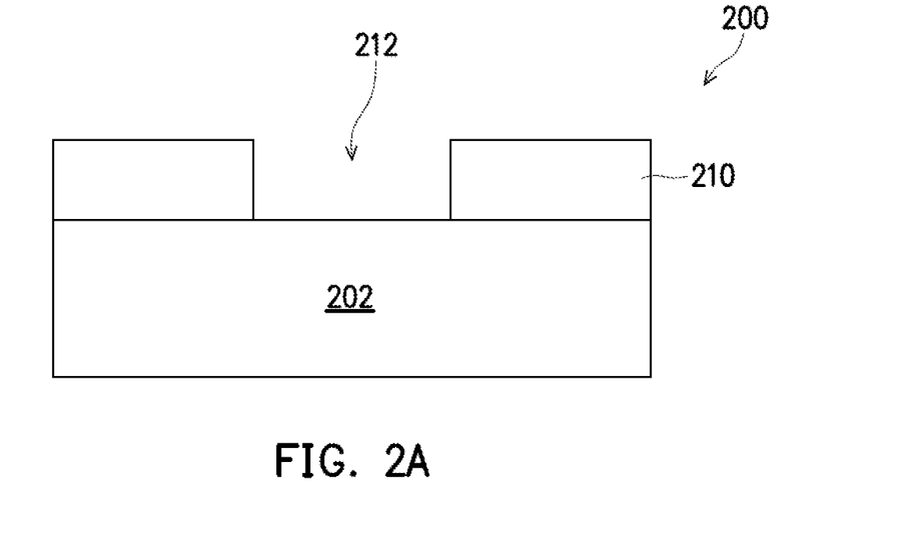
FIGS. 2A-2E are cross-sectional views of a semiconductor structure during various stages of the fabrication process, in accordance with some embodiments.

Referring to FIG. 1 and FIG. 2A, the method 100 includes operation 102, in which a first dielectric layer 210 over a substrate 202 is etched to form a contact opening 212. FIG. 2A is a cross-sectional view of a semiconductor structure 200 after etching the first dielectric layer 210 over the substrate 202 to form the contact opening 212, in accordance with some embodiments. It should be noted that although a single contact opening is illustrated in FIG. 2A, any number of contact openings is contemplated in the present disclosure.

The substrate 202 is first provided. In some embodiments, the substrate 202 is a bulk semiconductor substrate including silicon. Alternatively or additionally, in some embodiments, the bulk semiconductor substrate includes another elementary semiconductor such as germanium, a compound semiconductor including gallium arsenide, gallium phosphide, indium phosphide, indium arsenide, and/or indium antimonide, an alloy semiconductor including SiGe, GaAsP, AlInAs, AlGaAs, GaInAs, GaInP, and/or GaInAsP; or combinations thereof. In some embodiments, the substrate 202 includes an epitaxial layer. For example, the substrate 202 has an epitaxial layer overlying a bulk semiconductor substrate. Furthermore, in some embodiments, the substrate 202 is a semiconductor on insulator (SOI) substrate. For example, the substrate 202 includes a buried oxide (BOX) layer formed by a process such as separation by implanted oxygen (SIMOX) or other suitable techniques, such as wafer bonding and grinding.

In some embodiments, the substrate 202 further includes active devices such as p-type field effect transistors (PFET), n-type field effect transistors (NFET), metal-oxide semiconductor (MOS) transistors, complementary metal-oxide semiconductor (CMOS) transistors, bipolar transistors, high voltage transistors, and/or high frequency transistors. In some embodiments, the transistors are planar transistors or three-dimensional fin-type transistors. In some embodiments, the substrate 202 further includes passive devices such as resistors, capacitors, and/or inductors. The substrate 202 further includes isolation structures such as shallow trench isolation (STI) structures to separate various active and/or passive devices from one another. For simplicity, any such circuit elements are not shown in FIG. 2A.

Next, the first dielectric layer 210 is deposited over the substrate 202. In some embodiments and as in FIG. 2A, the first dielectric layer 210 is deposited directly above and in contact with the substrate 202. In some embodiments, one or more dielectric layers containing contact/interconnect structures therein are disposed between the first dielectric layer 210 and the substrate 202.

In some embodiments, the first dielectric layer 210 includes silicon oxide, silicon nitride, or silicon oxynitride. In some embodiments, the first dielectric layer 210 includes a low-k dielectric material having a dielectric constant (k) less than 4. In some embodiments, the low-k dielectric material has a dielectric constant of about 3.5 or less, about 3 or less, about 2.8 or less, about 2.5 or less, about 2.0 or less, or about 1.5 or less. In some embodiments, the first dielectric layer 210 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the first dielectric layer 210 is deposited by any suitable deposition process such as, for example, chemical vapor deposition (CVD), plasma enhanced chemical vapor deposition (PECVD), physical vapor deposition (PVD), or spin coating. In some embodiments, the first dielectric layer 210 is planarized by a planarization process or otherwise recessed to provide a planar top surface. In some embodiments, the top surface of the first dielectric layer 210 is planarized using a CMP process. The thickness of the first dielectric layer 210 can be from about 50 nm to about 5,000 nm, although lesser and greater thicknesses can also be employed.

The first dielectric layer 210 is subsequently etched to form the contact opening 212 therein. In some embodiments, the contact opening 212 is a trench opening or a combination of a trench opening and a via opening. In some embodiments, the first dielectric layer 210 is etched with lithography and etching processes. In some embodiments, the lithography process includes applying a photoresist layer (not shown) on the first dielectric layer 210, exposing the photoresist layer to a pattern, performing post-exposure baking, and developing the resist to form a patterned photoresist layer (not shown). The patterned photoresist layer exposes a portion of the first dielectric layer 210 where the contact opening 212 is to be formed. Next, the portion of the first dielectric layer 210 that is exposed by the patterned photoresist layer is etched to form the contact opening 212. In some embodiments, the first dielectric layer 210 is etched using a dry etch such as, for example, a reactive ion etch (RIE) or a plasma etch. In some embodiments, the first dielectric layer 210 is etched using a wet etch. After formation of the contact opening 212 in the first dielectric layer 210, the patterned photoresist layer is removed, for example, by wet stripping or plasma ashing. Alternatively, in some embodiments, a hard mask is used. The hard mask is formed between the photoresist layer and the first dielectric layer 210. Accordingly, the contact opening pattern is first transferred from the pattered photoresist layer to the hard mask by a first etch and then transferred from the patterned hard mask to the first dielectric layer 210 by a second etch.

Figure 2B:
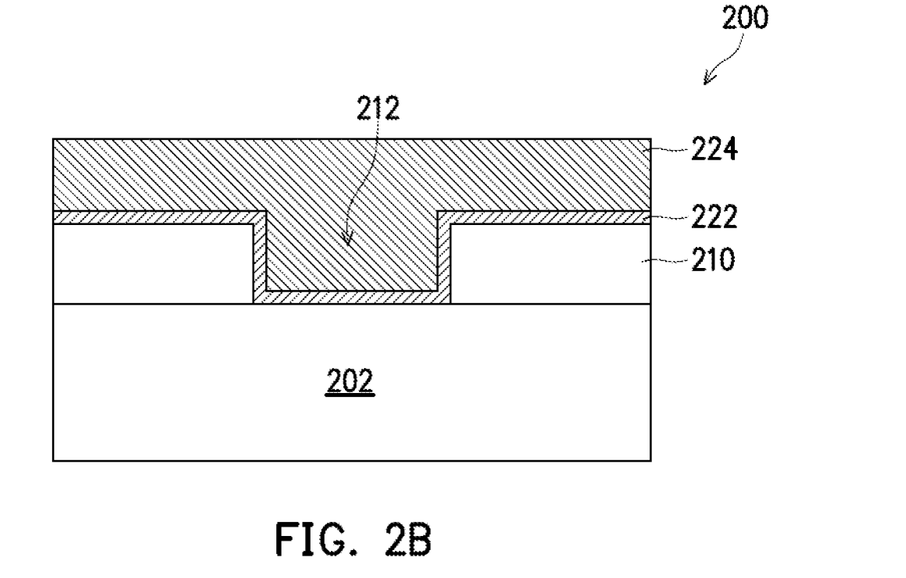

Referring to FIG. 1 and FIG. 2B, the method 100 proceeds to operation 104, in which a diffusion barrier layer 222 is deposited along sidewalls and bottom of the contact opening 212 and on a top surface of the first dielectric layer 210, followed by depositing a conductive material layer 224 on the diffusion barrier layer 222. FIG. 2B is a cross-sectional view of the semiconductor structure of FIG. 2A after depositing the diffusion barrier layer 222 along sidewalls and bottom of the contact opening 212 and on the top surface of the first dielectric layer 210 and depositing the conductive material layer 224 on the diffusion barrier layer 222, in accordance with some embodiments.

The diffusion barrier layer 222 is deposited over the exposed surfaces of the contact opening 212 and the first dielectric layer 210, including sidewall and bottom surfaces of the contact opening 212 and the top surface of the first dielectric layer 210. The diffusion barrier layer 222 is adapted to prevent diffusion of the conductive material subsequently deposited thereon to the first dielectric layer 210. The diffusion barrier layer 222 also acts as an adhesion agent to improve the adhesion of the conductive material to the first dielectric layer 210. In some embodiments, the diffusion barrier layer 222 includes a refractory metal such as, for example, titanium (Ti), tantalum (Ta), or ruthenium (Ru), a metal nitride such as titanium nitride (TiN) or tantalum nitride (TiN), or a bi-layer of the two such as Ti/TiN or Ta/TaN. In some embodiments, the diffusion barrier layer 222 is deposited utilizing a conformal deposition process such as CVD, PECVD, PVD, or atomic layer deposition (ALD). The diffusion barrier layer 222 that is formed can have a thickness ranging from about 2 nm to about 10 nm, although lesser and greater thicknesses can also be employed. If the thickness of the diffusion barrier layer 222 is too small, sufficient blocking of diffusion of the metal into the first dielectric layer 210 cannot be achieved. If the thickness of the diffusion barrier layer 222 is too great, the contact resistance of the resulting contact structure is too great, which leads to decrease of the device performance.

The conductive material layer 224 is then deposited on the diffusion barrier layer 222 to fill the remaining volume of the contact opening 212. In some embodiments, the conductive material layer 224 includes copper (Cu), aluminum (Al), tungsten (W), cobalt (Co), silver (Ag), gold (Au), CoW, CoF, CoSi, alloys thereof, or other suitable conductive metals. In some embodiments, any suitable deposition process such as, for example, CVD, PECVD, PVD, or plating deposits the conductive material layer 224. The deposition process is continued until the conductive material layer 224 fills the contact opening 212 and extends above the top surface of the first dielectric layer 210. In some embodiments, the conductive material layer 224 includes Cu deposited by PVD. In some other embodiments, the conductive material layer 224 includes Cu deposited by plating which can be electroplating or electroless plating. In various examples, Cu deposition may be implemented by other techniques. In some embodiments, a Cu reflow process may be added to enhance Cu filling profile. In some embodiments, when Cu or a Cu alloy is employed in the conductive material layer 224 and the conductive material layer 224 is formed by plating, an optional plating seed layer (not shown) is formed on the diffusion barrier layer 222 prior to the formation of the conductive material layer 224. In some embodiments, any suitable deposition process including, for example, CVD, PECVD, ALD, or PVD, forms the optional plating seed layer.

Figure 2C:
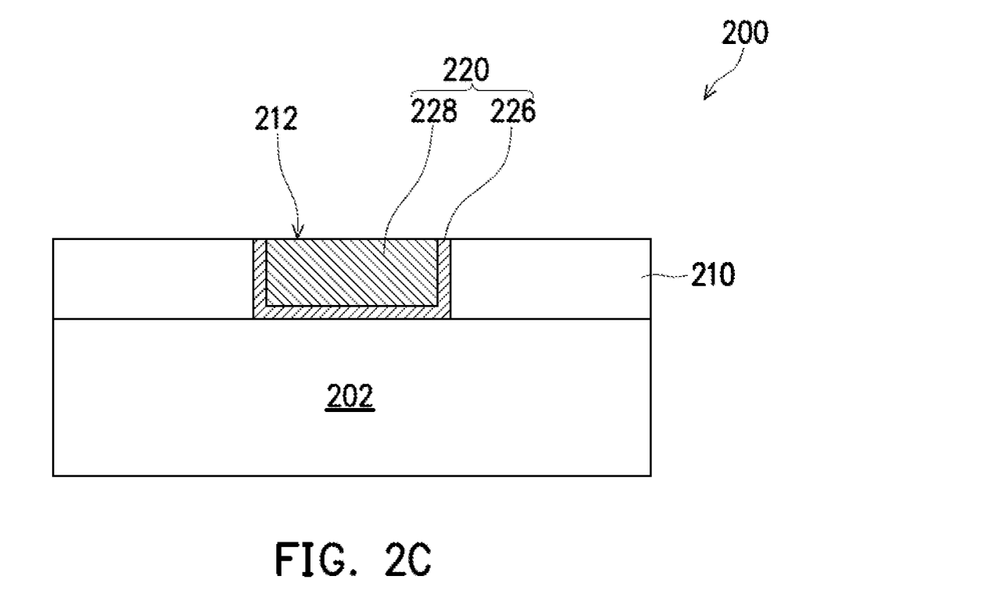

Referring to FIG. 1 and FIG. 2C, the method 100 proceeds to operation 106, in which the conductive material layer 224 and the diffusion barrier layer 222 are removed from the top surface of the first dielectric layer 210 to form an interconnect structure 220 within the contact opening 212. FIG. 2C is a cross-sectional view of the semiconductor structure 200 of FIG. 2B after removing the conductive material layer 224 and the diffusion barrier layer 222 from the top surface of the first dielectric layer 210 to form the interconnect structure 220 within the contact opening 212, in accordance with some embodiments.

The interconnect structure 220 includes a diffusion barrier 226 lining the sidewalls and bottom of the contact opening 212, and a conductive line 228 surrounded by the diffusion barrier 226. The interconnect structure 220 is formed by removing portions of the conductive material layer 224 and the diffusion barrier layer 222 that are located above the top surface of the first dielectric layer 210. In some embodiments, a CMP process is performed to remove excessive conductive material layer 224 and the diffusion barrier layer 222 over the first dielectric layer 210. The diffusion barrier layer 222 and the conductive material layer 224 in the contact opening 212 remain, forming the diffusion barrier 226 and the conductive line 228, respectively. The CMP process involves using a polishing slurry containing abrasive particles and one or more chemical additives such as an oxidizing agent, a chelating agent, a corrosion inhibitor, and a pH adjusting agent. In some embodiments, the abrasive particles may include, but are not limited to, silica, alumina, or ceria. The oxidizing agent may include, but are not limited to, hydrogen peroxide, potassium periodate, hypochlorous acid, or ozone. The chelating agent may include, but are not limited to, citric acid, potassium citrate, ethanol amine, or propanol amine. The corrosion inhibitor may include, but are not limited to, pyridine or azole. The pH adjusting agent may include hydrochloric acid, nitric acid, sulfuric acid, potassium hydroxide (KOH), ammonium hydroxide ($NH_4OH$), trimethyl amine (TMA), or triethylamine (TEA). The CMP process planarizes structure surfaces by means of both physical and chemical forces. As a result of the CMP process, the top surfaces of the diffusion barrier 226 and the conductive line 228 are coplanar with the top surface of the first dielectric layer 210.

Figure 2D:
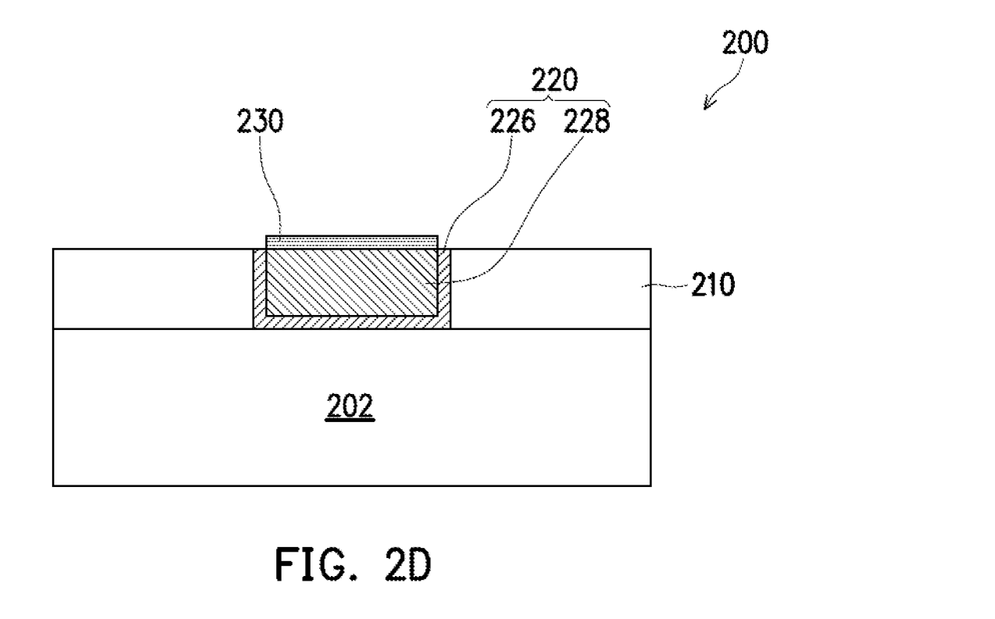

Referring to FIG. 1 and FIG. 2D, the method 100 proceeds to operation 108, in which a self-assembled monolayer 230 is selectively deposited on the conductive line 228 of the interconnect structure 220. FIG. 2D is a cross-sectional view of the semiconductor structure 200 of FIG. 2C after selectively depositing the self-assembled monolayer 230 on the conductive line 228 of the interconnect structure 220, in accordance with some embodiments.

To form the self-assembled monolayer 230, a solution including self-assembly molecules is prepared and applied to the top surfaces of the first dielectric layer 210, the diffusion barrier 226, and the conductive line 228 to provide a coating layer (not shown) covering the entire top surface of the semiconductor structure 200. The solution may be prepared by dissolving the self-assembly molecules in a solvent, and the application of the solution containing the self-assembly molecules may be carried out, for example, by spin coating.

The self-assembly molecule includes a head group which chemically binds only to the metal of the conductive line 228, and an end group which chemically binds only to a dielectric material. The head group and end group of the self-assembly molecule are selected such that the end group does not chemically bind to the dielectric material of the first dielectric layer 210 at the temperature where the coupling reaction between the head group of the self-assembly molecule and the metal of the conductive line 228 occurs. For example, in some embodiments, the head group and end group of the self-assembly molecule are selected such that the head group can bind to the metal of the conductive line 228 at room temperature, while the end group does not bind to the dielectric material of the first dielectric layer 210 at the room temperature, and the chemical coupling reaction between the end group of the self-assembly molecule and the dielectric material of the first dielectric layer 210 only occurs at an elevated temperature, for example, at a temperature greater than 100° C. Typically, the self-assembly molecule also does not chemically binds to a metal of diffusion barrier 226.

In some embodiments, the self-assembly molecule is represented by the following formula (I):

X-L-Q                  (I)

In formula (I), X represents a head group capable of binding to a metal surface. Examples of head group (X) include, but are not limited to, thiol, amine, selenol, isocyanide, carboxylic acid, hydroxaminc acid, phosphonic acid, and a nitrogen-containing heterocycle such as pyridine, dipyridine or terpyridine. Q represents an end group capable of binding to a dielectric material surface. Examples of end group (Q) include, but are not limited to, alkoxy silane such as trimethoxy silane (—$Si(OCH_3)_3$), chlorosilane (—$SiH_2Cl$), and trichlorosilicon (—SiCl$_3$). L represents a linker that connecting the head group and the end group. In some embodiments, L is alkylene. As used herein, "alkylene" refers to a divalent alky moiety. In other words, an "alkylene" moiety has two points of attachment to the rest of the molecule. As used herein, "alkyl" refers to straight or branched chain hydrocarbon groups having from 1 up to about 12 carbon atoms. In some embodiments, L is C1 to C6 alkylene. In some embodiments, L is ethylene. In some embodiments, the self-assembly molecule comprises 3-trimethoxysilylpropane-1-thiol, (3-aminopropyl)trimethoxysilane, or 3-mercaptopropionic acid.

In some embodiments, the self-assembly molecules are dissolved in a polar solvent to provide the solution. Examples of the polar solvent that can be used in the present disclosure include, but are not limited to, water, short-chain alcohols (e.g., butanol, isopropanol, propanol, ethanol, methanol), dioxane, tetrahydrofuran, dichloromethane, acetone, acetonitrile, dimethylformamide, dimethyl sulfoxide, acetic acid, formic acid, and combinations thereof. The concentration of the self-assembly molecules in the solution can be from 0.05% to 3%, although lesser or greater concentrations can be employed. If the concentration of the self-assembly molecules is too small, the monolayer coverage of self-assembly molecules on the conductive line may not be achieved. If the concentration of the self-assembly molecules is too great, the self-assembly molecules are wasted and the fabrication cost increases.

After applying the solution containing the self-assembly molecules to the top surfaces of the first dielectric layer 210, the diffusion barrier 226, and the conductive line 228 to form the coating layer, the semiconductor structure 200 is maintained at room temperature for a time duration sufficient for binding between the self-assembled molecules and the metal of the conductive line 228 to occur. Because the chemical binding between the self-assembly molecules and the first dielectric layer 210 does not occur at room temperature, the self-assembly molecules selectively bind with the metal of the conductive line 228, thereby forming the self-assembled monolayer 230 on the top surface of the conductive line 228, but not on the top surfaces of the first dielectric layer 210 and the diffusion barrier 226. The thickness of the self-assembled monolayer 230 depends on the length of the self-assembly molecules. In some embodiments, the self-assembled monolayer 230 has a thickness ranging from about 6 Å to about 12 Å, although lesser and greater thicknesses can also be employed. If the thickness of the self-assembled monolayer 230 is too small, the self-assembled monolayer 230 is not able to block the diffusion of the metal of the conductive line 228 into the overlying dielectric layer, which leads to leakage of integrated circuit. If the thickness of the self-assembled monolayer 230 is too great, the resistance of the resulting interconnect structure increases, which leads to the decrease of the device performance. In some embodiments, the self-assembled monolayer 230 has a thickness of about 8 Å. In some embodiments, the self-assembled monolayer 230 has a thickness of about 10 Å.

After forming the self-assembled monolayer 230, the top surfaces of the first dielectric layer 210, the diffusion barrier 226, and the conductive line 228 are subsequently rinsed to remove unbound self-assembly molecules from the top surfaces of the first dielectric layer 210, the diffusion barrier 226.

In some embodiments, the formation of the self-assembled monolayer 230 is performed after the CMP process. Accordingly, the removal of the unbound self-assembly molecules may be performed during the post-CMP cleaning process that is employed to remove contaminants generated by the CMP process. Accordingly, no additional rinse step is needed to remove the unbounded self-assembly molecules. Alternatively, in some embodiments, the formation of the self-assembled monolayer 230 may be performed after the post-CMP cleaning step. Accordingly, an additional rinse step is needed to remove the unbound self-assembly molecules from the semiconductor structure 200.

Figure 3:
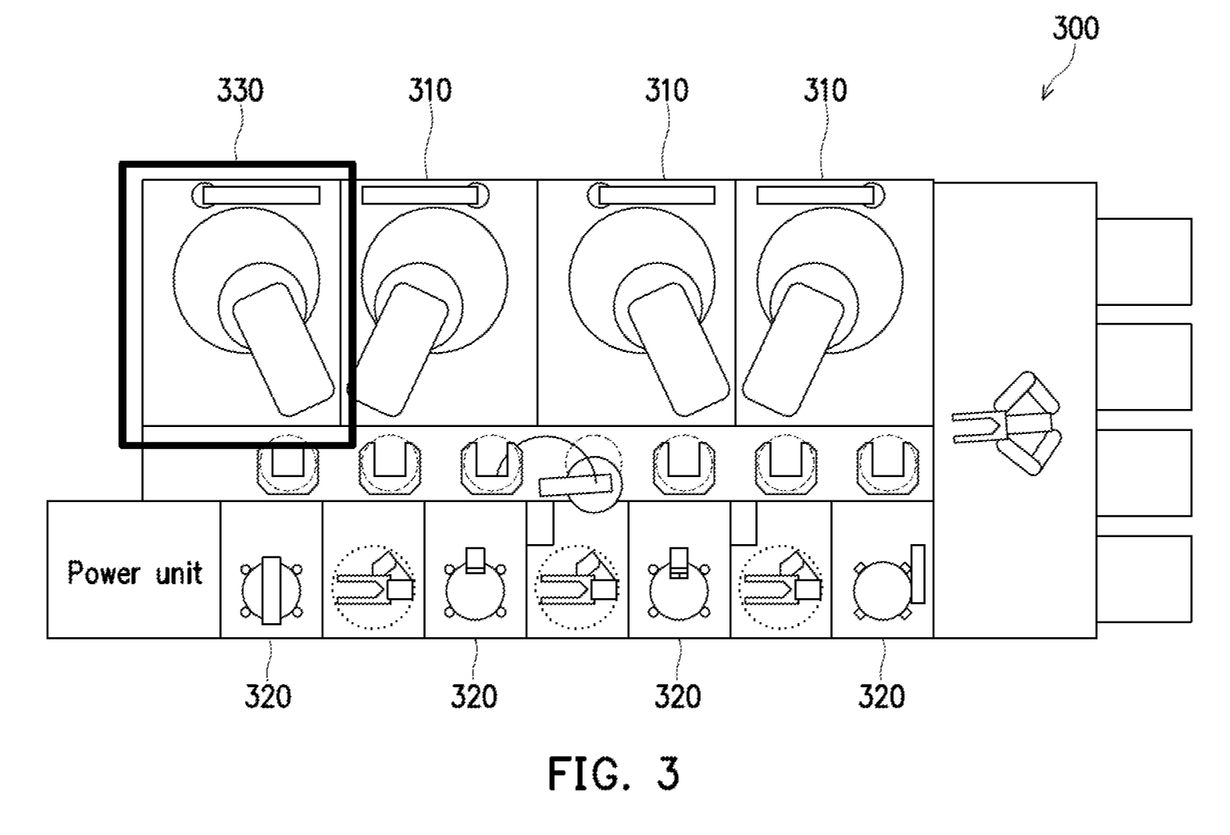
FIG. 3 is a schematic view of a CMP apparatus, in accordance with some embodiments.

The self-assembly process may be carried out in the CMP apparatus where the CMP process and the post-CMP cleaning process are performed (in-situ with CMP), and thus does not require a separate self-assembly system for performing such self-assembly process. FIG. 3 is a schematic view of a CMP apparatus 300 usable for formation of the self-assembled monolayer 230 in-situ with the CMP processes, in accordance with some embodiments. Referring to FIG. 3, the CMP apparatus 300 includes a plurality of polishing chambers 310 within which one or more CMP processes are performed to remove portions of conductive material layer 224 and the diffusion barrier layer 222 from the top surface of the first dielectric layer 210, a plurality of cleaning chambers 320 within which post-CMP cleaning to remove CMP residues is performed, and a self-assembly chamber 330 within which self-assembly of self-assembly molecules for formation of the self-assembled monolayer 230 on the conductive line 228 is performed. Although a single self-assembly chamber 330 is shown, any number of self-assembly chambers 320 is contemplated. In some embodiments, the self-assembly process is performed before the post-CMP cleaning process. In some embodiments, the self-assembly process is performed after the post-CMP cleaning process.

Figure 2E:
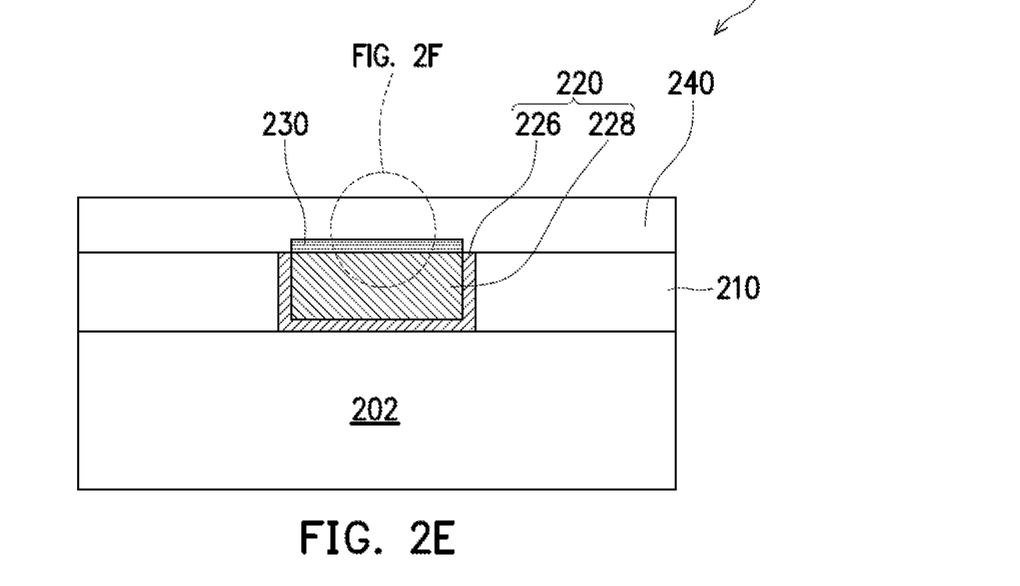

Referring to FIG. 1 and FIG. 2E, the method 100 proceeds to operation 110, in which a second dielectric layer 240 is deposited on the self-assembled monolayer 230, the diffusion barrier 226, and the first dielectric layer 210. FIG. 2E is a cross-sectional view of the semiconductor structure 200 of FIG. 2D after depositing the second dielectric layer 240 on the self-assembled monolayer 230, the diffusion barrier 226, and the first dielectric layer 210, in accordance with some embodiments.

The second dielectric layer 240 is deposited to cover self-assembled monolayer 230, the diffusion barrier 226, and the first dielectric layer 210. In some embodiments, the second dielectric layer 240 includes a dielectric material that is the same as, or different from, the dielectric material of the first dielectric layer 210. In some embodiments, the second dielectric layer 240 includes silicon oxide, silicon nitride, or silicon oxynitride. In some other embodiments, the second dielectric layer 240 includes a low-k dielectric material such as, for example, tetraethylorthosilicate (TEOS) oxide, undoped silicate glass, or doped silicate glass such as borophosphosilicate glass (BPSG), fluorosilica glass (FSG), phosphosilicate glass (PSG), or boron doped silicon glass (BSG). In some embodiments, the second dielectric layer 240 is deposited by any suitable deposition process such as, for example, CVD, PECVD, PVD, or spin coating. The thickness of the second dielectric layer 240 can be from about 50 nm to about 5,000 nm, although lesser and greater thicknesses can also be employed.

The deposition temperature is set to be higher than the binding temperature between the end group of the self-assembly molecule and the dielectric material of the second dielectric layer 240. In some embodiments, the second dielectric layer 240 is deposited at a temperature at 150° C. or higher. For example, in some embodiments, the second dielectric layer 240 is deposited at a temperature of about 170° C., about 200° C., about 250° C., about 300° C., about 350° C., about 400° C., or about 450° C. Accordingly, as the second dielectric layer 240 is being deposited on the self-assembled monolayer 230, the end group of the self-assembly molecule is chemically bonded with the dielectric material of the second dielectric layer 240. In some embodiments, the semiconductor structure 200 may be annealed to facilitate the binding between the self-assembled monolayer 230 and the second dielectric layer 240.

Figure 2F:
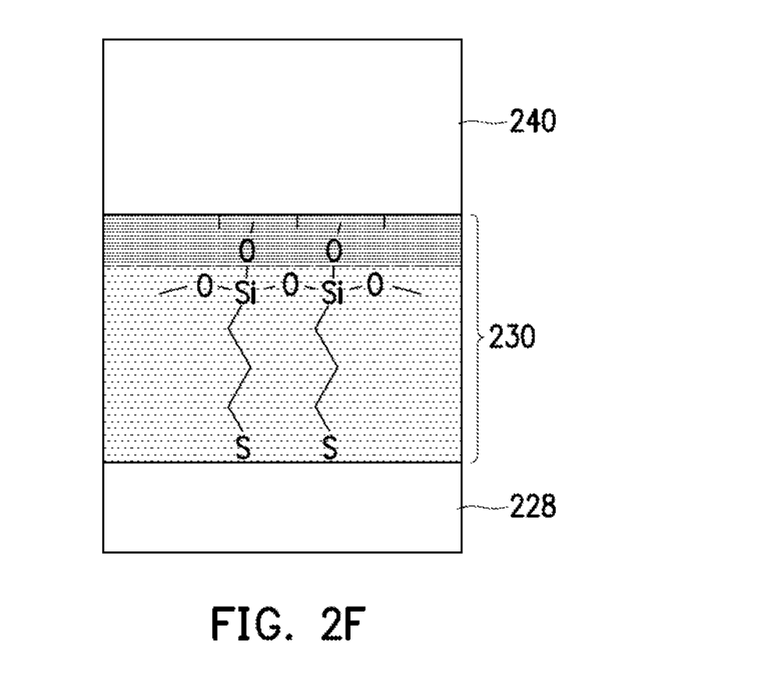
FIG. 2F illustrates a detailed portion of the semiconductor structure illustrated in FIG. 2E.

Referring to FIG. 2F, a detailed portion of the semiconductor structure 200 illustrated in FIG. 2E is provided. The self-assembled monolayer 230 is illustrated in greater detail and includes a monolayer of self-assembly molecules, for example, 3-trimethoxysilylpropane-1-thiol, formed between the conductive line 228 and the second dielectric layer 240. An S-metal bond is formed between the metal of the conductive line 228 and the thiol head group of 3-trimethoxysilylpropane-1-thiol, and a Si—O—Si bond is formed between the silicon of the second dielectric layer 240 and the silane end group 3-trimethoxysilylpropane-1-thiol.

Because the self-assembled monolayer 230 are chemically bonded to both the conductive line 228 and the second dielectric layer 240, the self-assembled monolayer 230 helps to enhance adhesion between the conductive line 228 and the second dielectric layer 240, which in turn helps to reduce peeling and/or delamination of the second dielectric layer 240 from the conductive line 228 during operation of the semiconductor structure 200. Furthermore, by capping the top surface of the conductive line 228 to prevent the direct contact of the conductive line 228 and the second dielectric layer, the self-assembled monolayer 230 helps to prevent the diffusion of metal from the conductive line 228 into the second dielectric layer. As a result, the leakage caused by the metal diffusion from the conductive line 228 to the second dielectric layer 240 during operation of the semiconductor structure 200 is also reduced.

Subsequently, another damascene process may be performed to form a plurality of contact structures in the second dielectric layer, thereby providing an upper metallization layer for formation of a multilayer interconnect structure.

One aspect of this description relates to a semiconductor structure. The semiconductor structure includes a substrate and a first dielectric layer on the substrate. A contact structure is embedded in the first dielectric layer includes a conductive line. The semiconductor structure further includes a self-assembled monolayer on the conductive line, and a second dielectric layer on the first dielectric layer and the conductive line. The self-assembled monolayer is chemically bonded to the conductive line and the second dielectric layer.

Another aspect of this description relates to a method of forming a semiconductor structure. The method includes forming a contact structure in a first dielectric layer, the contact structure comprising a diffusion barrier and a conductive line surrounded by the diffusion barrier. The method further includes forming a self-assembled monolayer on the conductive line, wherein the self-assembled monolayer comprises self-assembly molecules having the following formula (I):

X-L-Q (I)

wherein X is thiol, amine, selenol, isocyanide, carboxylic acid, hydroxamine acid, phosphonic acid, pyridine, dipyridine or terpyridine; Q is alkoxy silane, chlorosilane or trichlorosilicon; and L is alkylene. The method further includes depositing a second dielectric layer on the self-assembly monolayer and the first dielectric layer.

Still another aspect of this description relates to a method of forming a semiconductor structure. The method includes etching a first dielectric layer on a substrate to form a contact opening therein. The method further includes depositing a diffusion barrier layer along sidewalls and a bottom of the contact opening and on a top surface of the first dielectric layer. The method further includes depositing a conductive material layer on the diffusion barrier layer to fill a remaining volume of the contact opening. The method further includes performing a chemical mechanical polishing (CMP) process to remove excessive conductive material layer and the diffusion barrier layer from the top surface of the first dielectric layer, thereby forming a contact structure comprising a diffusion barrier and a conductive line surrounded by the diffusion barrier in the contact opening. The method further includes applying a solution comprising self-assembly molecules to the first dielectric layer, the diffusion barrier and the conductive line, wherein the self-assembly molecules are chemically bonded to a surface of the conductive line to form a self-assembled monolayer thereon through a head group thereof. The method further includes performing a post-CMP cleaning process to remove contaminants generated from the CMP process and unbound self-assembly molecules. The method further includes depositing a second dielectric layer on the self-assembled monolayer, the diffusion barrier and the second dielectric layer, wherein the self-assembly molecules are chemically bonded to the second dielectric layer through an end group thereof that is opposite the head group.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of forming a semiconductor structure, comprising:
    forming a contact structure in a first dielectric layer, the contact structure comprising a diffusion barrier and a conductive line surrounded by the diffusion barrier;
    forming a self-assembled monolayer on the conductive line, wherein the self-assembled monolayer comprises self-assembly molecules each having the following formula (I):

X-L-Q (I)

wherein:
        X is selenol, isocyanide, carboxylic acid, hydroxamine acid, phosphonic acid, pyridine, dipyridine or terpyridine;
        Q is alkoxy silane, chlorosilane or trichlorosilicon; and
        L is alkylene; and
    depositing a second dielectric layer on the self-assembly monolayer and the first dielectric layer.

2. The method of claim 1, wherein L is methylene, ethylene or propylene.

3. The method of claim 1, wherein forming the self-assembled monolayer comprises:

applying a solution comprising the self-assembly molecules to surfaces of the first dielectric layer, the diffusion barrier and the conductive line; and rinsing the first dielectric layer, the diffusion barrier and the self-assembled monolayer to remove unbound self-assembly molecules.

4. The method of claim 3, wherein forming the self-assembled monolayer is carried out at a first temperature at which no chemical binding between the self-assembly molecules and a dielectric material of the first dielectric layer occurs.

5. The method of claim 4, wherein the depositing the second dielectric layer is carried out at a second temperature at which a reaction between Q and a dielectric material of the second dielectric layer occurs, the second temperature is higher than the first temperature.

6. The method of claim 5, wherein the first temperature is room temperature, and the second temperature is greater than 100° C.

7. The method of claim 1, further comprising forming the first dielectric layer by depositing a dielectric material over a substrate using chemical vapor deposition, plasma enhanced chemical vapor deposition, physical vapor deposition or spin coating.

8. The method of claim 3, wherein forming the contact structure comprises:
    etching a contact opening in the first dielectric layer;
    depositing a diffusion barrier layer along sidewall surfaces and a bottom surface of the contact opening and on a top surface of the first dielectric layer;
    depositing a conductive material layer over the diffusion barrier layer; and
    performing a chemical mechanical polishing (CMP) process to remove portions of the conductive material layer and the diffusion barrier layer outside of the contact opening.

9. The method of claim 8, wherein rinsing the first dielectric layer, the diffusion barrier and the self-assembled monolayer also remove contaminants generated by the CMP process.

10. The method claim 8, further comprising performing a cleaning process to remove contaminants generated by the CMP process prior to forming the self-assembled monolayer.

11. A method of forming a semiconductor structure, comprising:
    etching a first dielectric layer on a substrate to form a contact opening therein;
    depositing a diffusion barrier layer along sidewalls and a bottom of the contact opening and on a top surface of the first dielectric layer;
    depositing a conductive material layer on the diffusion barrier layer to fill a remaining volume of the contact opening;
    performing a chemical mechanical polishing (CMP) process to remove excessive conductive material layer and the diffusion barrier layer from the top surface of the first dielectric layer, thereby forming a contact structure comprising a diffusion barrier and a conductive line surrounded by the diffusion barrier in the contact opening;
    applying a solution comprising self-assembly molecules to the first dielectric layer, the diffusion barrier and the conductive line, wherein each of the self-assembly molecules is chemically bonded to a surface of the conductive line to form a self-assembled monolayer thereon through a head group thereof, wherein the head group comprises thiol, selenol, isocyanide, carboxylic acid, hydroxaminc acid, phosphonic acid, pyridine, dipyridine or terpyridine;
    performing a post-CMP cleaning process to remove contaminants generated from the CMP process and unbound self-assembly molecules at the same time; and
    depositing a second dielectric layer on the self-assembled monolayer, the diffusion barrier and the second dielectric layer, wherein each of the self-assembly molecules is chemically bonded to the second dielectric layer through an end group thereof that is opposite the head group, wherein the end group comprises alkoxy silane, chlorosilane or trichlorosilicon.

12. The method of claim 11, wherein the head group is coupled to the end group through a linker, wherein the linker comprises C1-C6 alkylene.

13. The method of claim 11, wherein the first dielectric layer and the second dielectric layer independently comprise undoped silicate glass, borophosphosilicate glass (BPSG), fluorosilica glass (FSG), phosphosilicate glass (PSG) or boron doped silicate glass (BSG).

14. The method of claim 11, wherein the diffusion barrier layer comprises titanium (Ti), tantalum (Ta), ruthenium (Ru), titanium nitride (TiN), tantalum nitride (TaN), Ti/TiN or Ta/TaN.

15. The method of claim 11, wherein the conductive material layer comprises copper (Cu), aluminum (Al), tungsten (W), cobalt (Co), silver (Ag), gold (Au) or alloys thereof.

16. The method of claim 11, wherein the post-CMP cleaning process is carried out at room temperature.

17. A method of forming a semiconductor structure, comprising:
    forming a contact opening in a first dielectric layer;
    depositing a diffusion barrier layer along sidewall and bottom surfaces of the contact opening and on a top surface of the first dielectric layer;
    depositing a conductive material layer on the diffusion barrier layer to fill the contact opening;
    removing portion of the conducive material layer and the diffusion barrier layer located above the top surface of the first dielectric layer by chemical mechanical polishing (CMP), thereby forming a contact structure comprising a diffusion barrier and a conductive line surrounded by the diffusion barrier in the contact opening;
    forming a self-assembled monolayer on the conductive line, wherein the self-assembled monolayer comprises self-assembly molecules each having the following formula (I):

X-L-Q         (I)

wherein:
    X is thiol, amine, selenol, isocyanide, carboxylic acid, hydroxaminc acid, phosphonic acid, pyridine, dipyridine or terpyridine;
    Q is alkoxy silane, chlorosilane or trichlorosilicon; and
    L is alkylene;
simultaneously removing contaminants generated by CMP and unbound self-assembly molecules by performing a post-CMP cleaning process; and
depositing a second dielectric layer on the self-assembled monolayer, the diffusion barrier and the second dielectric layer,
wherein each of the self-assembly molecules is chemically bonded to the conductive line via X of the self-assembly molecule, and chemically bonded to the second dielectric layer via Q of the self-assembly molecule.

18. The method of claim 17, wherein L is methylene, ethylene or propylene.

19. The method of claim 17, wherein Q is trimethoxy silane.

20. The method of claim 17, wherein the self-assembly molecules comprise thiol trimethoxysilane, (3-aminopropyl) trimethoxysilane or 3-mercaptopropionic acid.

* * * * *